(12) United States Patent
Berding et al.

(10) Patent No.: US 12,489,022 B2
(45) Date of Patent: Dec. 2, 2025

(54) IN-SITU ETCH RATE AND ETCH RATE UNIFORMITY DETECTION SYSTEM

(71) Applicant: APPLIED MATERIALS, INC., Santa Clara, CA (US)

(72) Inventors: Keith Berding, San Jose, CA (US); Blake Erickson, Gilroy, CA (US); Soumendra Barman, San Jose, CA (US); Zhaozhao Zhu, Milpitas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 642 days.

(21) Appl. No.: 17/398,820

(22) Filed: Aug. 10, 2021

(65) Prior Publication Data

US 2022/0051953 A1 Feb. 17, 2022

Related U.S. Application Data

(60) Provisional application No. 63/064,854, filed on Aug. 12, 2020.

(51) Int. Cl.
*H01L 21/66* (2006.01)
*H01L 21/3213* (2006.01)

(52) U.S. Cl.
CPC ........ *H01L 22/26* (2013.01); *H01L 21/32139* (2013.01)

(58) Field of Classification Search
None
See application file for complete search history.

(56) References Cited

U.S. PATENT DOCUMENTS

| 5,450,205 | A | 9/1995 | Sawin et al. |
| 5,694,207 | A | 12/1997 | Hung et al. |
| 6,270,622 | B1 | 8/2001 | Klippert, II et al. |
| 10,910,201 | B1 * | 2/2021 | Chen ............... H01L 21/3065 |
| 2013/0080984 | A1 * | 3/2013 | Liu .................. G06F 30/398 |
| | | | 716/112 |

(Continued)

FOREIGN PATENT DOCUMENTS

WO 2001018845 A1 3/2001

*Primary Examiner* — Alexander G Ghyka
(74) *Attorney, Agent, or Firm* — Lowenstein Sandler LLP

(57) ABSTRACT

An article, apparatus, and method for detecting an etch rate uniformity in a processing chamber of an electronics processing system is provided. A device is placed in a processing chamber of an electronics processing system. The device includes a first layer deposited on a surface of the device and a second layer deposited on the first layer. The first layer is composed of a first sense material and the second layer is composed of an etch material. During an etch process at the processing chamber, a first amount of time from an initiation of the etch process to a detection of a first indication of completion of etching of the second layer at a first portion of the surface of the device is measured. The etch process etches the second layer of the device based on an initial set of etch parameter settings. A first etch rate of the processing chamber is determined based on the measured first amount of time and a thickness of the second layer. An optimized set of etch parameter settings to be applied at the processing chamber during subsequent etch processes is determined based on the first etch rate of the processing chamber.

17 Claims, 10 Drawing Sheets

(56) References Cited

U.S. PATENT DOCUMENTS

| | | | |
|---|---|---|---|
| 2013/0157387 A1* | 6/2013 | Chen | H01L 21/31116 156/345.25 |
| 2014/0038091 A1* | 2/2014 | Grimbergen | G03F 1/80 430/5 |
| 2020/0006100 A1 | 1/2020 | Clark et al. | |
| 2020/0098648 A1* | 3/2020 | Liu | H01L 22/12 |
| 2022/0051954 A1* | 2/2022 | Berding | H01J 37/32963 |

* cited by examiner

IN-SITU ETCH RATE AND ETCH RATE UNIFORMITY DETECTION SYSTEM

RELATED APPLICATIONS

This application claims the benefit under 35 U.S.C. § 119(e) of U.S. Provisional Patent Application No. 63/064,854, filed Aug. 12, 2020, which is incorporated herein, in its entirety, by this reference.

TECHNICAL FIELD

Embodiments of the present disclosure relate, in general, to in-situ etch rate and etch rate uniformity detection of a processing chamber.

BACKGROUND

Measuring an etch rate of a processing chamber can be helpful in controlling the quality and consistency of devices processed at an electronics processing system. However, measuring and controlling an etch rate of a processing chamber, as well as a uniformity of the etch rate, presents a common challenge in the electronics device manufacturing industry. In general, an etch rate of a processing chamber is determined based on an amount of material etched from a device during an etch process performed for a particular amount of time. An etch rate uniformity is determined based on a measured etch rate for multiple devices etched at different areas of the processing chamber. Conventional etch rate and/or etch rate uniformity measurement techniques include several time consuming external measurements, such as external metrology measurements, for multiple devices (e.g., wafers, substrates, etc.) to determine the amount of material etched from each device during the etch process. For example, multiple devices each including a layer of etch material can be etched at different locations within a processing chamber. The thickness of the material on each device is measured, using external metrology, before and after the etch process to determine the amount of material etched from a particular device. An etch rate of each device can be determined based on the amount of material etched from the device and the length of the etch process. An etch rate uniformity of the processing chamber can be determined based on difference between each determined etch rate.

Identifying etch process parameter settings to control the etch rate uniformity of a processing chamber is a necessary part of process recipe development and overall system optimization. Experiments can be performed at a process chamber to identify a set of process parameter settings for a target etch rate uniformity. During such experiments, system operators can perform multiple etch processes using different devices placed at different locations within the processing chamber at different etch parameter settings and obtain measurements for each process. Each round of measurements for each etch process involves multiple external measurements of the etched material before and after the process. The amount of time to perform an external measurement before and after the etch process for each device can contribute to a significant amount of time and resources used during the experimentation to identify the target set of process parameter settings, limiting the amount of parameter setting optimization that can be obtained.

During operation of an electronic device manufacturing system, the uniformity of an etch process performed at a process chamber can be monitored in order to detect any process defects. In order to monitor the selectivity of the process chamber during operation, an external measurement is obtained for multiple devices prior to an etch process, the etch process is performed, another external measurement is obtained for the devices after the etch process, and an etch material uniformity is determined based on these measurements. In response to determining the measured etch rate uniformity does not correspond to a target etch material uniformity, etch process parameter settings can be modified, and the etch material uniformity can be measured for a subsequent set of devices. These operations (can be performed multiple times until the etch parameter settings for the process chamber allow for a target etch rate and/or etch rate uniformity The performance of multiple external measurement operations to determine the etch parameter settings is time-consuming and contributes to the overall latency of the electronics processing system.

SUMMARY

Some of the embodiments described herein cover a method including causing a device to be placed in a processing chamber of an electronics processing system. The device includes a first layer deposited on a surface of the device, and a second layer deposited on the first layer. The first layer is composed of a first sense material and the second layer is composed of an etch material. A first amount of time from an initiation of the etch process to a detection of a first indication of completion of etching of the second layer at a first portion of the surface of the device is measured during an etch process at the processing chamber. The etch process etches the second layer of the device based on an initial set of etch parameter settings. A first etch rate is determined based on the measured first amount of time and a thickness of the second layer. An optimized set of etch parameter settings to be applied at the processing chamber during subsequent etch processes is determined based on the first etch rate of the processing chamber.

In some embodiments, a device includes a first layer deposited on a surface of the device and a second layer deposited on the first layer. The first layer is composed of a first sense material and the second layer is composed of an etch material. In response to the second layer being etched during an etch process performed at the processing chamber, the first layer can be detected at a first portion of the surface of the device.

In some embodiments, an electronics processing system includes a transfer chamber including a robot arm, a processing chamber connected to the transfer chamber, the processing chamber including an optical detection component to detect an indication of completion of an etch process performed within the processing chamber, and a controller operatively coupled to the robot arm and the optical detection component. The controller can cause the robot arm to place a device in the processing chamber. The device includes a first layer deposited on a surface of the device and a second layer deposited on the first layer. The first layer can be composed of a first sense material and the second layer can be composed of an etch material. A first amount of time can be measured, during an etch process performed at the processing chamber, from an initiation of the etch process to a detection of a first indication, by the optical detection component, of a completion of etching of the second layer at a first portion of the surface of the device. The etch process etches the second layer based on an initial set of etch parameter settings. A first etch rate of the processing chamber can be determined based on the measured first amount of time and a thickness of the second layer. An optimized set of etch parameter settings to be applied during subsequent etch processes can be determined based on the first etch rate of the processing chamber.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Figure 1:
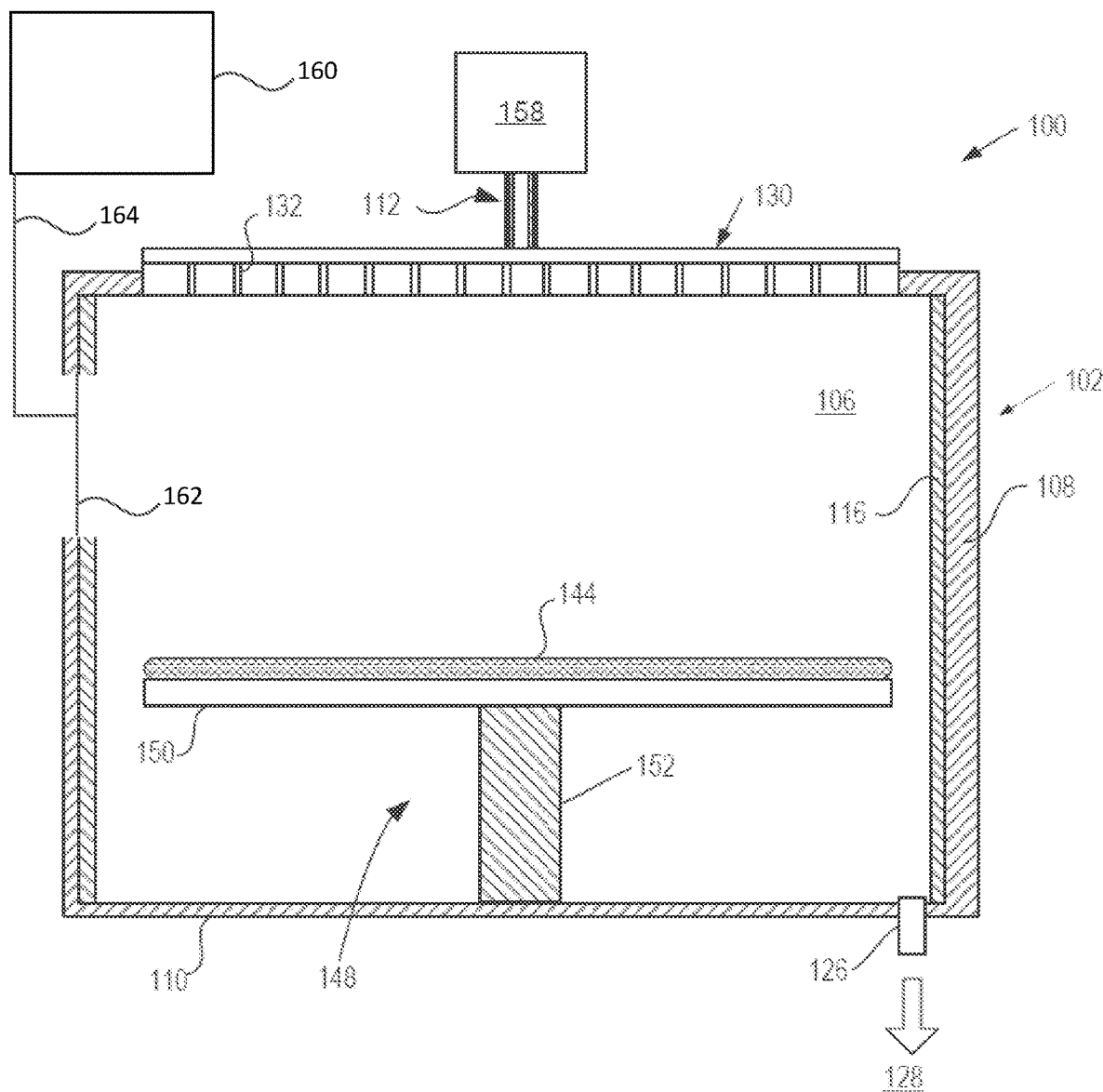
FIG. 1 is a top schematic view of an example processing system, according to aspects of the present disclosure.

Embodiments described herein are related to articles, systems, and methods for in-situ etch rate and etch rate uniformity detection within a processing chamber of an electronics processing system. An etch rate can refer to a rate at which an etch material deposited on a surface of a device is etched at one or more portions of the surface of the device. In some embodiments, an etch rate can be determined based on an amount of etch material deposited on a surface of a device that is etched away over a period of time. An etch rate uniformity can refer to a percentage of etch rate variation across the surface of the device. In some embodiments, an etch rate uniformity can be determined based on at least a first etch rate determined for a first portion of a surface of a device and a second etch rate determined for a second portion of the device. In some embodiments, an etch rate can be determined to be uniform across a surface of a device if a percentage of etch rate variation across the surface of a device satisfies a threshold percentage.

In some embodiments, a device including a sense material and an etch material can be used to determine an etch rate and/or an etch rate uniformity of a processing chamber. A first layer can be deposited on a surface of the device, where the first layer includes a sense material. A sense material can include a dielectric material, such as a silicon-based material (e.g., silicon oxide ($SiO_2$), silicon nitride ($Si_3N_4$), poly silicon, etc.). In some embodiments, the sense material can include a metal material, such as a copper-based material or a tungsten-based material. An optical detection component can identify a sense material can based on a detectable optical signature optical signature. The optical signature of a sense material can correspond to a wavelength of a set of photons emitted by a plasma of the sense material within the processing chamber. A second layer including an etch material can be deposited on the first layer. The etch material can be etched from the surface of the device during the etch process.

The device can be placed in a processing chamber of an electronics processing system where an etch process can be performed based on an initial set of etch parameter settings to etch the second layer of device. During the etch process, an optical detection component of the processing chamber can detect one or more optical signatures of materials within the processing chamber. At least one detected optical signature can correspond with to the sense material of the first layer. A first amount of time from the beginning of the etch process to a detection of an optical signature of the sense material can be measured. An etch rate of the processing chamber can be determined based on a thickness of the second layer and the measured first amount of time. An optimized set of etch parameter settings can be determined based on the etch rate of the processing chamber.

An etch rate uniformity can be determined based on an amplitude of the optical signature of the sense material during the etch process. In some embodiments, during a first time period during the etch process, the amplitude of the detected optical signature can be lower than a particular amplitude associated with the sense material of the first layer. During a second time period during the etch process, the amplitude of the optical signature can increase to the specific amplitude. During a third time period, the amplitude of the optical signature can stop increasing. An etch rate uniformity of the processing chamber can be determined based on the amount of time between the first time period (i.e., when the sense material is first detected) and the third time period (i.e., when the amplitude of the optical signature no longer continues to increase). An optimized set of etch parameter settings can be determined based on the determined etch rate uniformity.

In some embodiments, the first layer deposited on the surface of the device can include two or more sense materials, where each sense material is deposited at a distinct portion of the device. Each sense material can be associated with a distinct optical signature that is detectable by an optical detection component. During the etch process, the optical detection component can detect optical signatures associated with each distinct sense material. An amount of time from the beginning of the etch process to a detection of an optical signature associated with a distinct sense material can be measured for each sense material deposited on the surface of the device. An etch rate can be determined based on the thickness of the second layer and each amount of time measured for each distinct sense material. Each determined etch rate can be compared to another determined etch rate to identify a difference between each etch rate. In response to determining a difference between each etch rate exceeds difference threshold, it can be determined that an overall etch rate of the processing chamber is not uniform. As such, the optimized set of etch parameter settings can be determined such to cause the overall etch rate of the processing chamber to be uniform.

In an illustrative example, the first layer deposited on the device can include a first sense material deposited on a first portion of the device and a second sense material deposited on a second portion of the device. A second layer can be deposited on the first layer, where the second layer has a thickness of approximately 10 nm. During an etch process at a processing chamber, an optical detection component can detect a first optical signature associated with the first sense material at approximately 1 second after the etch process is initiated. The optical detection component can detect a second optical signature associated with the second sense material at approximately 2 seconds after the etch process is initiated. Based on the thickness of the second layer and the measured time periods, a first etch rate associated with the first portion of the device can be determined to be 10 nm/s, while a second etch rate associated with the first portion of the device can be determined to be 5 nm/s. In response to determining a difference between the first etch rate and the second etch rate exceed a difference threshold, it can be determined that etching is not performed uniformly across the surface of a device at the processing chamber. As such, an optimized set of etch parameter settings can be determined to cause the etch rate associated with the first portion of the device to approximately match the etch rate associated with the second portion of the device.

In some embodiments, an etch rate for two or more processing chambers of an electronics processing system can be determined in accordance with previously described embodiments. Each etch rate for each processing chamber can be compared to another etch rate for another processing chamber to determine a difference between etch rates of processing chambers of the electronics processing system. In response to determining a difference between the compared etch rates exceeds a difference threshold, optimized parameters for one or more of the processing chambers of the electronics processing system can be determined in order to control etch rate uniformity across each processing chamber of the electronics processing system.

By using techniques described in the present disclosure, an etch rate and/or etch rate uniformity can be determined for a processing chamber of an electronics processing system without performing multiple time-consuming external measurement operations. The device, including the etch material and one or more sense materials, can be specially designed to detect an etch rate at one or more specific portions of the surface of the device. Therefore, portions of the surface of the device that are not etched at the same etch rate as other portions of the surface can be more easily and quickly detected. In some implementations, the portions of the surface of the device that are not etched at the same etch rate can be detected by testing as few as one device including the one or more sense materials. As such, optimized parameter settings can be more easily determined to cause the portions of the surface of the device to be etched at the same rate as the other portions of the surface of the device at a processing chamber, increasing quality and consistency of each device processed at the processing chamber. Further, by more easily determining optimized parameter settings for each processing chamber of an electronics device processing system, quality and consistency of each device processed in the electronics processing system can be increased, increasing overall system yield.

FIG. 1 depicts a sectional view of a processing chamber 100, in accordance with embodiments of the present disclosure. The processing chamber 100 can be used for processes in which a corrosive plasma environment is provided. For example, the processing chamber 100 can be a chamber for a plasma etcher or plasma etch reactor, and so forth. In one embodiment, the processing chamber 100 includes a chamber body 102 and a showerhead 130 that encloses an interior volume 106. The showerhead 130 can include a showerhead base and a showerhead gas distribution plate. Alternatively, the showerhead 130 can be replaced by a lid and a nozzle in some embodiments, or by multiple pie shaped showerhead compartments and plasma generation units in other embodiments. The chamber body 102 can be fabricated from aluminum, stainless steel or other suitable material such as titanium (Ti). The chamber body 102 generally includes sidewalls 108 and a bottom 110.

An outer liner 116 can be disposed adjacent the sidewalls 108 to protect the chamber body 102. The outer liner 116 can be fabricated to include one or more apertures. In some embodiments, the outer liner 116 is fabricated from $Y_2O_3$, $Al_2O_3$, and so forth.

An exhaust port 126 can be defined in the chamber body 102, and can couple the interior volume 106 to a pump system 128. The pump system 128 can include one or more pumps and throttle valves utilized to evacuate and regulate the pressure of the interior volume 106 of the processing chamber 100.

The showerhead 130 can be supported on the sidewall 108 of the chamber body 102. The showerhead 130 (or lid) can be opened to allow access to the interior volume 106 of the processing chamber 100, and can provide a seal for the processing chamber 100 while closed. A gas panel 158 can be coupled to the processing chamber 100 to provide process and/or cleaning gases to the interior volume 106 through the showerhead 130 or lid and nozzle (e.g., through apertures of the showerhead or lid and nozzle). Showerhead 130 can be used for processing chambers used for dielectric etch (etching of dielectric materials). The showerhead 130 can include a gas distribution plate (GDP) and can have multiple gas delivery holes 132 (also referred to as channels) throughout the GDP. The showerhead 130 can be formed by metal or alloy plate with the protection by a multi-layer protective coating as described herein. The metal or alloy plate can be composed of aluminum, an aluminum alloy, or another metal or metal alloy. The showerhead 130 can be formed with the GDP bonded to an aluminum base or an anodized aluminum base. The GDP can be made from Si or SiC, or can be a ceramic such as $Y_2O_3$, $Al_2O_3$, $Y_3Al_5O_{12}$ (YAG), and so forth.

For processing chambers used for conductor etch (etching of conductive materials), a lid can be used rather than a showerhead. The lid can include a center nozzle that fits into a center hole of the lid. The lid can be a ceramic such as $Al_2O_3$, $Y_2O_3$, YAG, or a ceramic compound including $Y_4Al_2O_9$ and a solid-solution of $Y_2O_3$—$ZrO_2$. The nozzle can also be a ceramic, such as $Y_2O_3$, YAG, or the ceramic compound including $Y_4Al_2O_9$ and a solid-solution of $Y_2O_3$—$ZrO_2$.

Examples of processing gases that can be used to process devices in the processing chamber 100 include halogen-containing gases, such as $C_2F_6$, $SF_6$, $SiCl_4$, HBr, $NF_3$, $CF_4$, $CHF_3$, $CH_2F_3$, F, $NF_3$, $Cl_2$, $CCl_4$, $BCl_3$ and $SiF_4$, among others, and other gases such as $O_2$, or $N_2O$. A remote plasma can be formed from any of these and/or other processing gases and then delivered through the plasma delivery line 112 to chamber 100. Accordingly, the remote plasma can be composed of $C_2F_6$, $SF_6$, $SiCl_4$, HBr, $NF_3$, $CF_4$, $CHF_3$, $CH_2F_3$, F, $NF_3$, $Cl_2$, $CCl_4$, $BCl_3$ and $SiF_4$, among others, and other gases such as $O_2$, or $N_2O$. Examples of carrier gases include $N_2$, He, Ar, and other gases inert to process gases (e.g., non-reactive gases).

A device support assembly 148 is disposed in the interior volume 106 of the processing chamber 100 below the showerhead 130. The device support assembly 148 holds a device 144 during processing. A ring (e.g., a single ring) can cover a portion of the electrostatic chuck 150, and can protect the covered portion from exposure to plasma during processing. The ring can be silicon or quartz in one embodiment.

An inner liner can be coated on the periphery of the device support assembly 148. The inner liner can be a halogen-containing gas resist material such as those discussed with reference to the outer liner 116. In one embodiment, the inner liner can be fabricated from the same materials of the outer liner 116.

In one embodiment, the device support assembly 148 includes a pedestal 152 that supports an electrostatic chuck 150. The electrostatic chuck 150 further includes a thermally conductive base that can include one or more optional embedded heating elements, embedded thermal isolators and/or conduits to control a lateral temperature profile of the device support assembly 148. The electrostatic chuck 150 can further include multiple gas passages such as grooves, mesas and other surface features that can be formed in an upper surface of the electrostatic chuck 150. The gas passages can be fluidly coupled to a source of a heat transfer (or backside) gas such as Him via holes drilled in the electrostatic chuck 150. In operation, the backside gas can be provided at controlled pressure into the gas passages to enhance the heat transfer between the electrostatic chuck 150 and a supported device 144. The electrostatic chuck 150 can include at least one clamping electrode controlled by a chucking power source.

In some embodiments, processing chamber 100 can be equipped with an optical detection component 160. Optical detection component 160 can detect optical signatures associated with materials in processing chamber 100. In some embodiments, an optical signature can correspond with a wavelength of a set of photons emitted by a plasma of each material in the processing chamber 100 during a process (e.g., an etch process). In some embodiments, optical detection component 160 can be an optical emission spectroscopy (OES) device. Optical detection component 160 can measure an amplitude of various wavelengths of photons emitted by one or more materials etched from the surface of the device. In other or similar embodiments, optical detection component 160 can be a device configured to detect a specific wavelength of photons emitted by a single material etched from the surface of the device. It should be noted that, while the optical detection component 160 can detect and measure the wavelengths of photons emitted by one or more materials etched from the surface of the device, optical detection component 160 can also detect and measure the wavelengths of photons emitted by each material in the processing chamber 100 (e.g., etch plasma gases, coatings deposited on the walls of the processing chamber 100, etc.).

In some embodiments, optical detection component 160 can be displaced outside of processing chamber 100. In such embodiments, optical detection component 160 can be configured to detect optical signatures associated with materials in the processing chamber 100 from outside of processing chamber 100. Optical detection component 160 can be configured to detect optical signatures through a transparent portion (e.g., a window) embedded within a portion of chamber body 102. For example, optical detection component 160 can be configured to detect optical signatures through a window 162 embedded within a sidewall 108, a liner 116, bottom 110, and/or showerhead 130. Photons within processing chamber 100 can be transmitted to optical detection component 160 through a photon transmission cable 164, such as a fiber optic cable, through window 162. In other or similar embodiments, one or more components of optical detection component 160 can be displaced inside of processing chamber 100. In some implementations, a process performed within processing chamber 100 can be performed in a vacuum environment. As such, one or more components of optical detection component 160 that are configured to operate within a vacuum environment can be displaced inside of processing chamber 100.

In some embodiments, optical detection component 160 can be operatively coupled to a system controller (not shown). The system controller can be and/or include a computing device such as a personal computer, a server computer, a programmable logic controller (PLC), a microcontroller, and so on. The system controller can include one or more processing devices, which can be general-purpose processing devices such as a microprocessor, central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device can also be one or more special-purpose processing devices such as an application specific integrated circuit (ASIC), a field programmable gate array (FPGA), a digital signal processor (DSP), network processor, or the like. The system controller can include a data storage device (e.g., one or more disk drives and/or solid state drives), a main memory, a static memory, a network interface, and/or other components. The system controller can execute instructions to perform any one or more of the methodologies and/or embodiments described herein. The instructions can be stored on a computer readable storage medium, which can include the main memory, static memory, secondary storage and/or processing device (during execution of the instructions). The system controller can also be configured to permit entry and display of data, operating commands, and the like by a human operator.

Optical detection component 160 can transmit data relating to a detected optical signature to the system controller during an etch process performed at processing chamber 100. In some embodiments, optical detection component 160 can transmit measurements of amplitudes of wavelengths detected at a surface of device 144 to the system controller. The system controller, upon receipt of the optical signature data, can generate a spectrum associated with all optical signatures detected by optical detection component 160, such as spectrum 300 of FIG. 3. Further details regarding the spectrum are provided herein.

In some embodiments, a first layer can be deposited on a surface of device 144. The first layer can include one or more sense materials. A plasma of the sense material can be associated with an optical signature that is detectable by optical detection component 160. In some embodiments, a sense material can be deposited on all portions of a surface of device 144. In other embodiments, two or more sense materials can be deposited on the surface of device 144, where each sense material is deposited on a distinct portion of the surface of device 144. In some embodiments, a sense material can be a dielectric material, such as a silicon-based material (e.g., silicon oxide ($SiO_2$), silicon nitride ($Si_3N_4$), poly silicon, etc.). The sense material can also be a metallic material, such as a copper-based material or a tungsten-based material. In some embodiments, the sense material can be any materials that emit photons having a wavelength of between approximately 200 nanometers (nm) (i.e., ultra-violet photons) and approximately 1100 nm (i.e., near infra-red photons). A second layer can be deposited on the first layer of device 144. The second layer can include an etch material. An etch material can be a material that is etched from the surface of device 144 during an etch process. In some embodiments, the etch material can be at least one of an aluminum (Al)-based material, indium tin oxide (ITO), a chromium (Cr)-based material, a gold (Au)-based material, a molybdenum (Mo)-based material, a platinum (Pt)-based material, a silicon (Si)-based material, a tantalum (Ta)-based material, a titanium (Ti)-based material, a copper (Cu)-based material, or a tungsten (W)-based material. In some embodiments, a third layer can also be placed on the second layer of device 144. The third layer can include a mask such as a hard mask (e.g., a metal mask) or a soft mask (e.g., tape, etc.). A mask can define one or more features that are to be etched onto the surface of the device (e.g., holes, patterns, etc.).

A processing device (e.g., the system controller, a processing device coupled to the system controller, etc.) can cause device 144 to be placed in processing chamber 10 and an etch process can be performed to etch the second layer of device 144 from the surface of device 144. In some embodiments, the initial set of etch parameter settings can include at least one of a temperature setting of the interior volume 106 of process chamber 100, a pressure setting of interior volume 106, a gas flow rate of gases provided by gas panel 158 to interior volume 106, a composition of gases provided by gas panel 158 to interior volume 106, and so forth.

As discussed previously, optical detection component 160 is configured to detect one or more optical signatures from a plasma within the processing chamber 100. During a first period of the etch process, the optical signature detected by optical detection component 160 do not correspond to a sense material of the first layer of device 144. During a second period of the etch process, optical detection component 160 can detect one or more optical signatures that correspond with the one or more sense materials of the first layer of device 144. The detection of the optical signatures associated with the one or more sense materials can indicate that the etch material of the second layer has been etched away at one or more portions of the device. As such, the detection of the optical signatures associated with the one or more sense materials can be an indication that etching is complete at the one or more portions of the surface of device 144. In some embodiments, an etch rate of the processing chamber can be determined based on an amount of time between the initiation of the etch process and an indication of completion of etching at the surface of device 144 and a thickness of the second layer prior to the etch process. For example, the etch rate of the processing chamber can be determined based on the amount of time of the first period of the etch process.

In some embodiments, a processing device can determine an etch rate uniformity based on an amplitude (e.g., number of photons) of a detected optical signature for a sense material of the first layer deposited on device 144. For example, a single sense material can be deposited on all portions of the surface of device 144. During the second period of the etch process, optical detection component 160 can detect an optical signature of the sense material. During the second period, an amplitude of the detected optical signature can be lower than a threshold amplitude. The threshold amplitude can be defined based on a maximum amplitude for the sense material that can be detected by optical detection component 160, where the maximum amplitude is a function of the surface area of device 144 that is covered by the sense material. The amplitude of the detected optical signature can increase to approximately the threshold amplitude during the second period of the etch process. During a third period of the etch process, optical detection component 160 can detect that the amplitude of the optical signature is no longer increasing and instead remains at the threshold amplitude. In some embodiments, the processing device can determine that the etch rate of processing chamber 100 is not uniform if the amount of time of the second period of the etch process (i.e., the amount of time that the amplitude of the detected optical signature increases) exceeds a threshold time. If the amount of time of the second period exceeds the threshold time, the processing device determines the etch material of the second layer is not etched uniformly. The processing device can determine that the etch rate of processing chamber 100 is uniform if the amount of time of the second period does not exceed a threshold time. If the amount of the second period does not exceed the time threshold, the etch material of the second layer is etched uniformly, as all or most of the sense material is exposed relatively quickly.

In some embodiments, the processing device can determine an etch rate uniformity based on a detection of optical signatures each associated with two or more sense materials of the first layer deposited on a surface of device 144. For example, two or more sense materials can be deposited on distinct portions of the surface of device 144. A first sense material can be deposited around an outer diameter of the surface of device 144 and a second sense material can be deposited around an inner diameter of the surface of device 144. Each sense material can be associated with a distinct optical signature that is detectable by optical detection component 160. During a first period of the etch process, optical detection component 160 does not detect optical signatures associated with the first sense material or the second sense material. During a second period of the etch process, optical detection component 160 can detect a first optical signature corresponding with the first sense material deposited around the outer diameter of the surface of device 144. During a third period of the etch process, optical detection component 160 can detect a second optical signature corresponding with the second sense material deposited around the inner diameter of the surface of device 144. The detection of the first optical signature can indicate that etching is complete at the outer diameter of the surface of the device while the detection of the second optical signature can indicate that etching is complete at the inner diameter of the surface of the device. In some embodiments, the processing device can determine that the etch rate of processing chamber 100 is not uniform if the amount of time between the beginning of the second period (i.e., the detection of the first optical signature) and the beginning of the third period (i.e., the detection of the second optical signature) exceeds a difference threshold. If the amount of time between the beginning of the second period and the beginning of the third period exceeds the difference threshold, the processing device can determine the etch material of the second layer is not etched uniformly (i.e., the etch material at the outer diameter of the surface of device 144 is etched before the etch material at the inner diameter of the surface of device 144). The processing device can determine that the etch rate of processing chamber 100 is uniform if the amount of time between the beginning of the second period and the beginning of the third period does not exceed a difference threshold. If the amount of time between the beginning of the second period and the beginning of the third period does not exceed a difference threshold, the etch material of the second layer is etched uniformly as the etch material at the outer diameter of the surface of device 144 is etched at the same time or around the same time as the etch material at the inner diameter of the surface of device 144.

The processing device (e.g., the system controller) can determine an optimized set of etch parameter settings to be applied at processing chamber 100 during subsequent etch processes on the determination of whether the etch rate of the processing chamber is uniform across the surface of device 144. In response to determining the etch rate is uniform across the surface of device 144, the processing device can set the optimized set of etch parameter settings to be applied at processing chamber 100 during a subsequent etch process as the initial set of etch parameter settings applied at processing chamber 100 during the etch process. In response to determining the etch rate is not uniform across the surface of device 144, the processing device can determine the optimized set of etch parameter settings to cause the etch rate to be uniform across the surface of device 144 during subsequent etch processes. In some embodiments, the optimized set of etch parameter settings can include at least one of a temperature setting of the interior volume 106 of process chamber 100, a pressure setting of interior volume 106, a gas flow rate of gases provided by gas panel 158 to interior volume 106, a composition of gases provided by gas panel 158 to interior volume 106, etc.

Figure 2B:
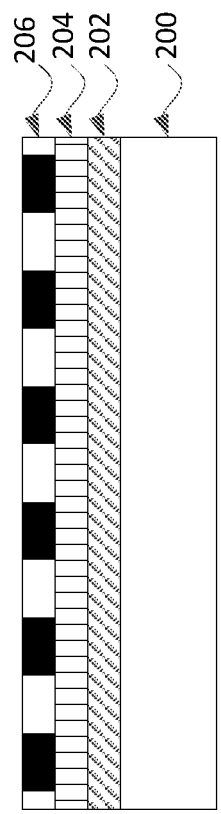
FIG. 2A and FIG. 2B depict an example device for in-situ detection of an etch rate uniformity of a processing chamber, according to aspects of the present disclosure.
Figure 2A:
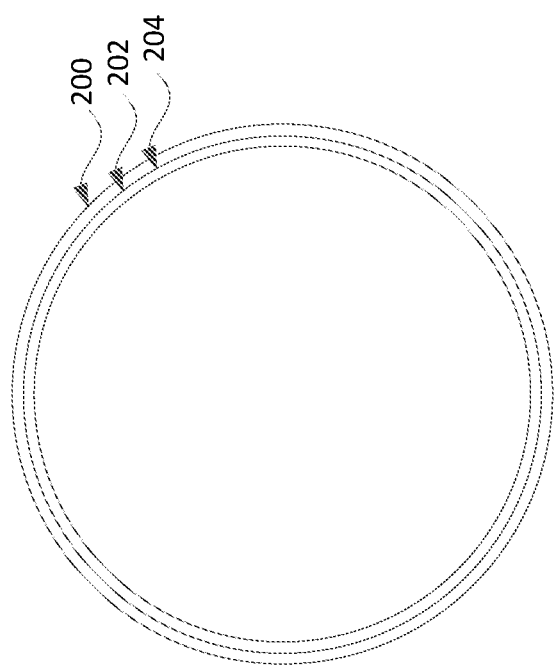

FIGS. 2A-2H depict example devices for in-situ detection of an etch rate and/or an etch rate uniformity of a processing chamber of an electronics processing system, according to aspects of the present disclosure. Referring to FIGS. 2A and 2B, a first layer 202 can be deposited on a surface of a device 200. First layer 202 can include a sense material. The sense material can be a material associated with an optical signature, in accordance with previously described embodiments. In some embodiments, the optical signature can be detected by an optical detection component, such as optical detection component 160 described with respect to FIG. 1, during an etch process at the processing chamber. In such embodiments, the optical signature can be associated with a wavelength of light emitted by the sense material, as detected by the optical detection component. The sense material of first layer 202 can be associated with a first optical signature.

A second layer 204 can be deposited on first layer 202. Second layer 204 can include an etch material. When processed in a processing chamber, such as an etching chamber, the etch material can be etched away, thus exposing first layer 202. In some embodiments, a third layer 206 can be positioned on second layer 204. Third layer 206 can include a mask, such as a hard mask (e.g., a metal mask) or a soft mask (e.g., tape, etc.), that defines features on the surface of device 200. In some embodiments, each layer deposited on the surface of the device 200 can be deposited on an entire surface of the device 200. For example, at least one of first layer 202, second layer 204, or third layer 206 can be deposited to cover the entire surface of device 200.

During an etch process, an optical detection component can detect one or more optical signatures emitted by a plasma of materials within the processing chamber. As described previously with respect to FIG. 1, the optical detection component can transmit data relating to detected optical signatures to a processing device (e.g., a system controller) during the etch process. For example, the optical detection component can transmit a measured amplitude (e.g., number of photons) of a wavelength for an optical signature to the system controller. The processing device, upon receipt of the optical signature data, can generate a spectrum associated with all optical signatures detected by the optical detection component, such as spectrum 300 of FIG. 3.

Figure 2D:
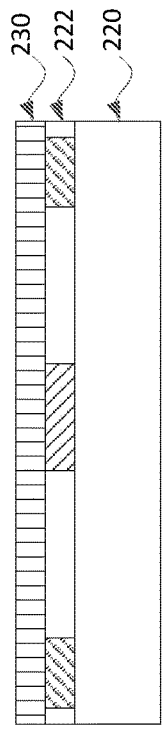
FIG. 2C and FIG. 2D depict another example device for in-situ detection of an etch rate uniformity of a processing chamber, according to aspects of the present disclosure.
Figure 2F:
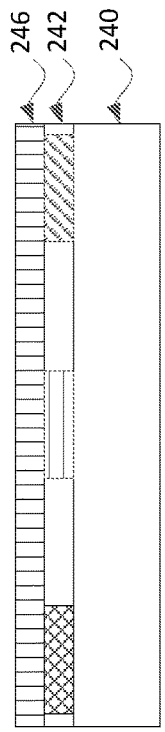
FIG. 2E and FIG. 2F depict another example device for in-situ detection of an etch rate uniformity of a processing chamber, according to aspects of the present disclosure.
Figure 2C:
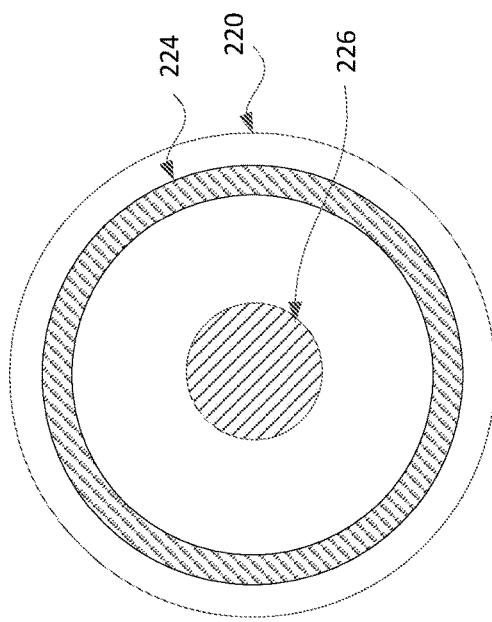
Figure 2E:
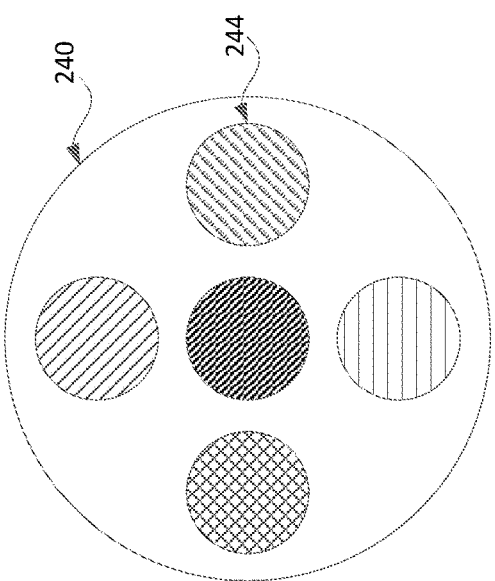
Figure 2H:
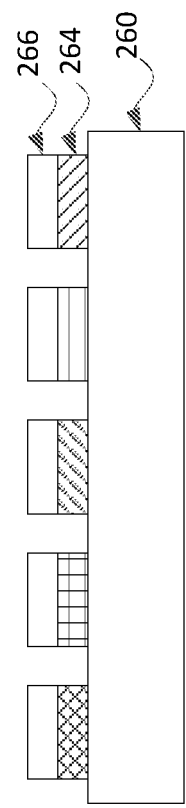
FIG. 2G and FIG. 2H depict another example device for in-situ detection of an etch rate uniformity of a processing chamber, according to aspects of the present disclosure.
Figure 2G:
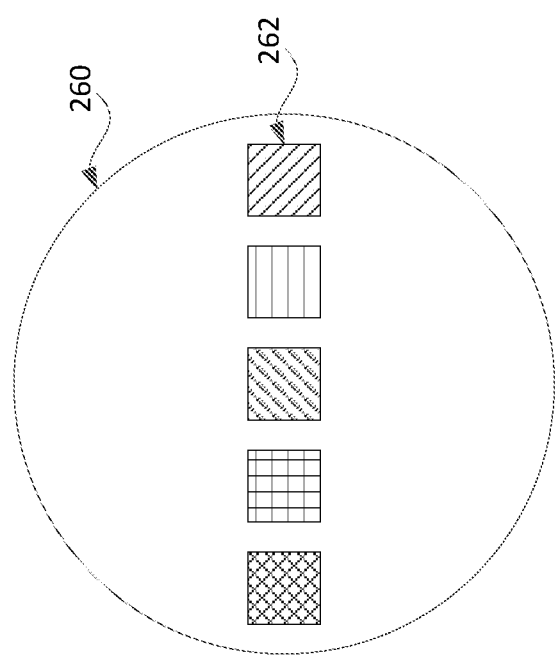
Figure 3:
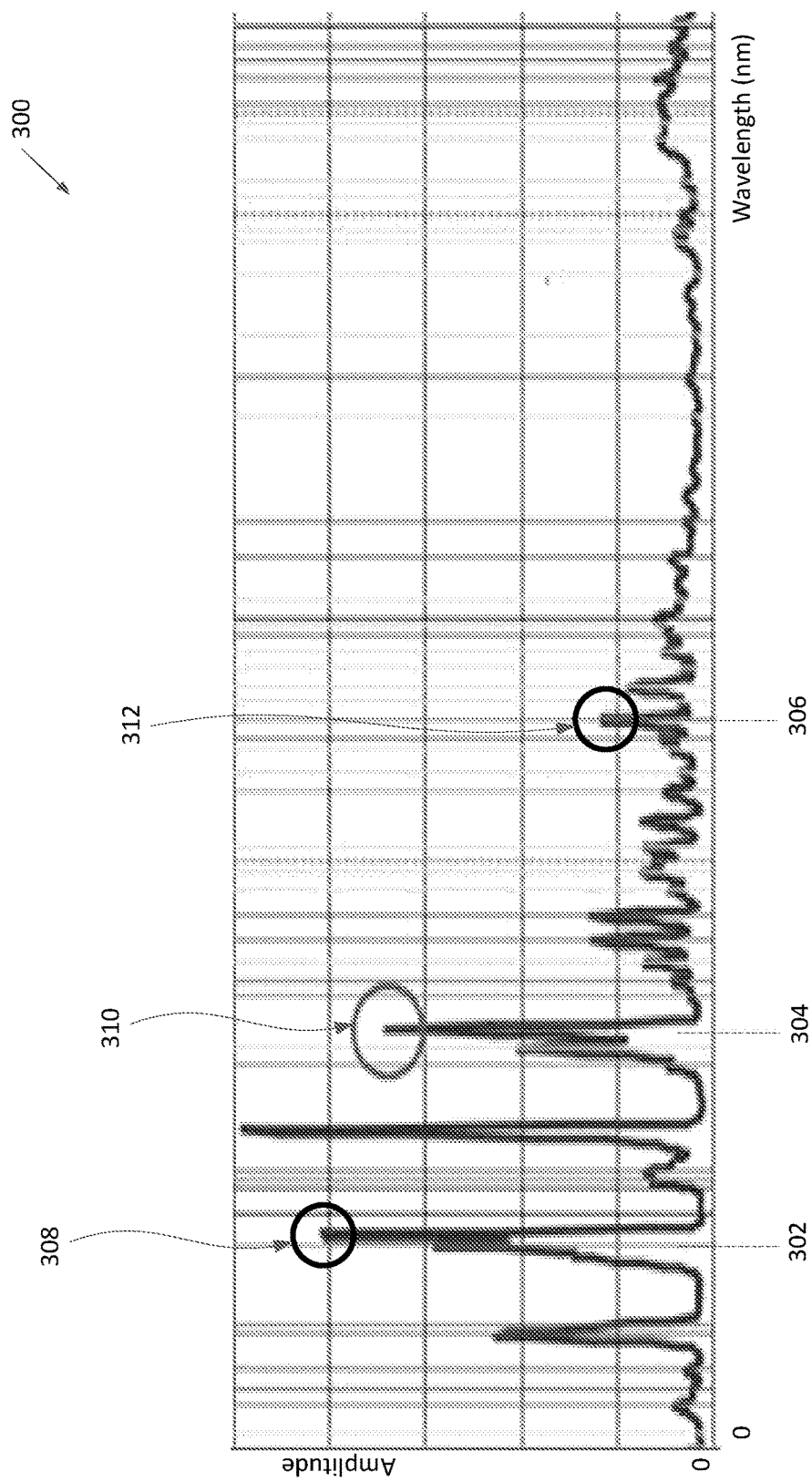
FIG. 3 depicts an example spectrum of an optical detection component of a processing chamber, according to aspects of the present disclosure.

FIG. 3 depicts an example spectrum 300, according to aspects of the present disclosure. Spectrum 300 can be generated by the processing device (e.g., a system controller of an electronics processing system) upon receipt of optical signature data collected by an optical detection component of a processing chamber. As described previously, the optical detection component can measure the amplitude (i.e., a number of photons) of wavelengths emitted by a plasma materials in the processing chamber. A particular wavelength can correspond to a material of a first layer deposited on a surface of the device. For example, a first sense material deposited on a surface of the device can correspond with wavelength 302. In some embodiments, multiple sense materials can be deposited on the surface of the device, as described with respect to FIGS. 2C-2H. In accordance with the previous example, a second sense material deposited on the surface of the device can correspond with wavelength 304. Spectrum 300 can include optical signatures of materials in the processing chamber that are not deposited on the surface of the device. For example, wavelength 306 can correspond with a material used for a component of the processing chamber, as described with respect to FIG. 1.

As described previously, the optical detection component can measure an amplitude of each optical signature detected within the processing chamber. Each amplitude can be represented by a peak of spectrum 300. For example, the amplitude of wavelength 302 can be represented by peak 308, the amplitude of wavelength 304 can be represented by peak 310, and the amplitude of wavelength 306 can be represented by peak 312. The amplitude of each optical signature can change during the etch process. For example, as more of the first sense material of the first layer is exposed during the etch process, the amplitude of wavelength 302 can increase. Similarly, as more of the second sense material is exposed during the etch process, the amplitude of wavelength 304 can increase. As wavelength 306 is not associated with a material that is deposited on the surface of the device, the amplitude of wavelength 306 can remain approximately constant during the etch process. Data corresponding to the detected optical signatures and the measured amplitudes of each optical signature can be recorded for various points in time during the etch process (e.g., seconds). The recorded data can be used to generate a graph indicating a change in an amplitude of an optical signature for a particular material during the etch process, as illustrated with respect to FIGS. 4A-5B.

Figure 4A:
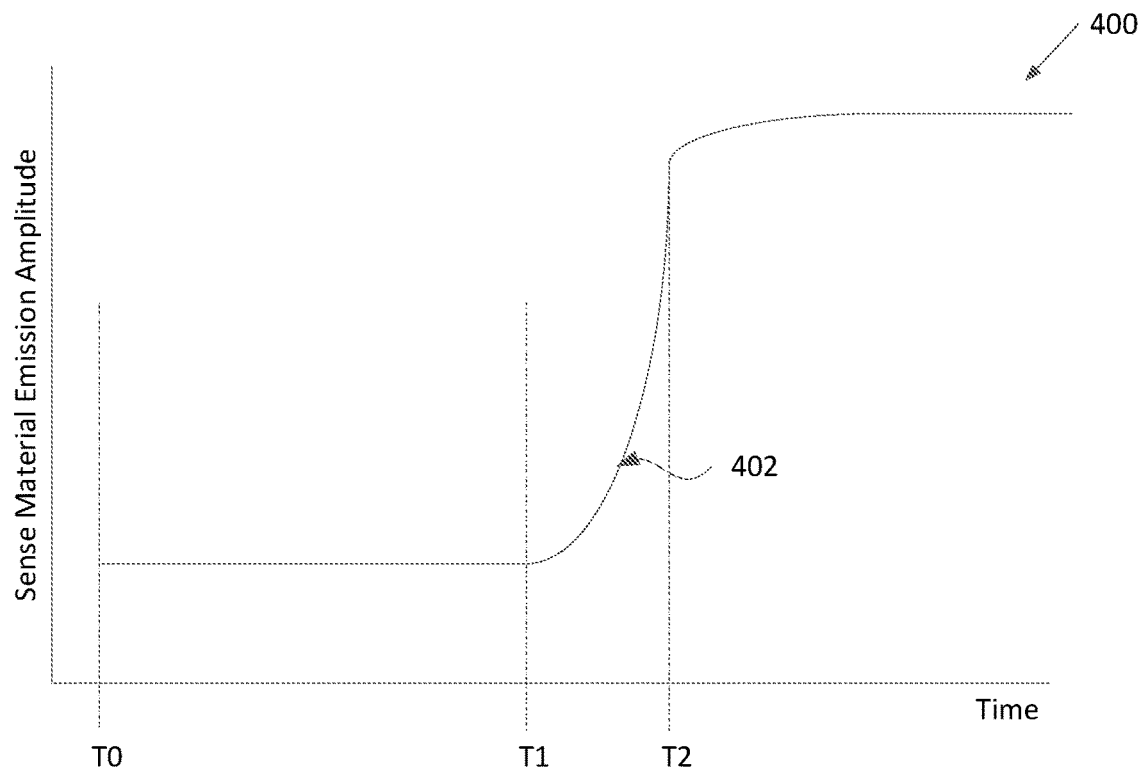
FIG. 4A depicts a graph indicating an emission amplitude of an optical signature associated with a sense material over time, according to aspects of the present disclosure.

FIG. 4A depicts a graph 400 indicating an emission amplitude of an optical signature associated with a sense material over time, according to aspects of the present disclosure. An optical signature for the sense material can be detected by an optical detection component of a processing chamber during an etch process performed for a device, such as device 200 of FIGS. 2A and 2B. A processing device can generate graph 400 based on data from a spectrum, such as spectrum 300 of FIG. 3. The etch process can begin at time T0. During a first period of the etch process (from time T0 to time T1), an etch material of a second layer 204 deposited on the surface of device 200 is etched away. The optical detection component does not detect the first layer 202 deposited on the surface of device 200 during the first period of the etch process. At an initial time during the first period of the etch process, the optical detection component can detect the etch material based an optical signature associated with the etch material, in accordance with previously described embodiments. At a subsequent time during the first period, the optical detection component can detect that an amplitude of the optical signature associated with the etch material has decreased. In some embodiments, the optical signature associated with the etch material continues to decrease until approximately an initial time of a second time period of the etch process (from time T1 to time T2). During the second period of the etch process, the optical detection component detects the sense material of the first layer 202. The second period can begin at a time at which the amplitude of the optical signature associated with the etch material no longer continues to decrease (i.e., remains constant). In other or similar embodiments, the second period can begin at a time at which the amplitude of the optical signature associated with the sense material begins to increase.

The optical detection component can detect a sense material based on the optical signature associated with the sense material, in accordance with previously described embodiments. A processing device can determine the etch rate of the processing chamber based on an amount of time of the first period of the etch process and a thickness of the second layer 204 deposited on the surface of device 200.

An optical signature for a sense material can be associated with an optical signature criterion. The optical signature criterion can be defined based on a maximum amplitude for the sense material that can be detected by the optical detection component, where the maximum amplitude is a function of the surface area of device 200. During the second period of the etch process, a processing device can determine an amplitude of the detected optical signature does not satisfy an optical signature criterion (i.e., is lower than a threshold amplitude). The amplitude of the detected optical signature can increase during the second period of the etch process so the optical signature satisfies the optical signature criterion (i.e., the amplitude of the optical signature increases to approximately the threshold amplitude). This is illustrated by curve 402 of FIG. 4A. During a third period of the etch process (starting at time T2), the optical detection component can detect that the amplitude of the optical signature is no longer increasing and instead can remain at the threshold amplitude.

In some embodiments, a processing device can determine whether the etch rate is uniform across the surface of device 200 based on a threshold duration of time between a first point in time that an optical signature associated with the sense material was detected by the optical detection component and a second point in time that an amplitude of the optical signature remained at the threshold amplitude. The duration of time between the first point in time and the second point in time can correspond with the duration of the second period of graph 400 (i.e., the amount of time from when the optical signature of the sense material was first detected the amplitude remained at a constant amplitude). The processing device can determine that the etch rate is uniform across the surface of device 200 in response to determining that the duration of time between the first point in time and the second point in time satisfies the threshold duration of time. In an illustrative example, the threshold duration of time can be approximately 0.3 seconds. Time T1 of graph 400 can indicate approximately 1 second after the initiation of the etch process at a processing chamber (e.g., at T0). Time T2 of graph 400 can indicate approximately 1.2 seconds after the initiation of the etch process. The duration of time between time T1 and time T2 can be approximately 0.2 seconds. As 0.2 seconds is less than the threshold duration of time of approximately 0.3 seconds, the processing device can determine that the etch rate is uniform across the surface of device 200. In such embodiments, the processing device can set the initial etch parameter used during the etch process associated with graph 400 to be optimized etch parameter settings.

Figure 4B:
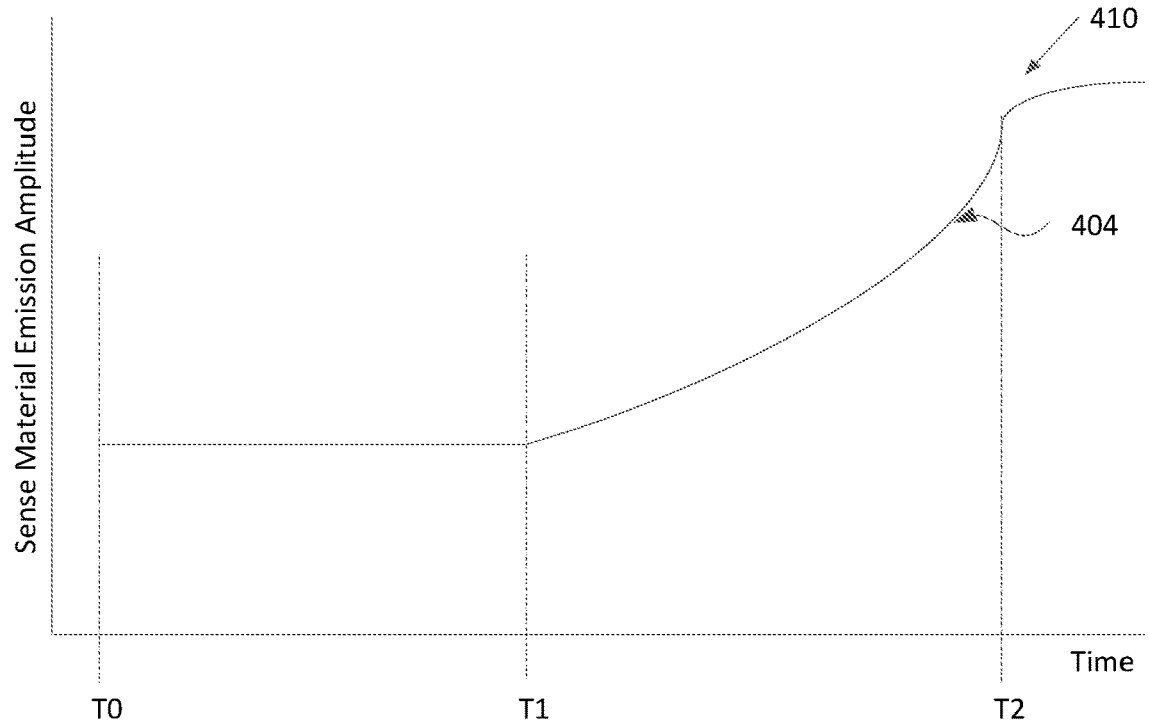
FIG. 4B depicts another graph indicating an emission amplitude of an optical signature associated with a sense material over time

FIG. 4B depicts a graph 410 indicating an emission amplitude of an optical signature associated with a sense material over time, according to aspects of the present disclosure. Graph 410 can be generated in accordance with embodiments described with respect to FIG. 4A. In accordance with the previous illustrative example, the threshold duration of time between a first point in time that an optical signature associated with the sense material was detected by the optical detection component and a second point in time that an amplitude of the optical signature remained at a constant amplitude can be approximately 0.3 seconds. Time T1 of graph 410 (i.e., the time that curve 404 begins to increase) can indicate approximately 1 second after the initiation of the etch process at a processing chamber (e.g., at T0). Time T2 of graph 410 (i.e., the time that curve 404 remains at a constant amplitude) can indicate approximately 2 seconds after time T1. The duration of time between time T1 and time T2 can be approximately 2 seconds. As 2 seconds is more than the threshold duration of time of approximately 0.3 seconds, the processing device can determine that the etch rate is not uniform across the surface of device 200. In such embodiments, the processing device can modify the initial etch parameter settings used during the etch process associated with graph 410 to decrease the duration of time between time T1 and time T2.

Referring now to FIGS. 2C and 2D, a first layer 222 can be deposited on a surface of a device 220. First layer 222 can include two or more sense materials. For example, first layer 222 can include at least a first sense material 224 and a second sense material 226, as illustrated. First sense material 224 and second sense material 226 can be deposited on distinct portions of the surface of device 220. For example, first sense material 224 and second sense material 226 can be deposited in a radial pattern such that first sense material 224 is deposited at an outer diameter of device 220 and second sense material 226 is deposited at an inner diameter, or a center, of device 220. First sense material 224 and second sense material 226 can each be associated with a distinct optical signature. Each optical signature can correspond to a specific wavelength that is detectable by the optical detection component. By depositing the first sense material 224 on the outer diameter and the second sense material 226 on the inner diameter, a processing device can detect whether the edges of the surface of device 220 are etching more quickly than the center of the surface of device 220 during the etch process.

A second layer 230 can be deposited on first layer 222. Second layer 230 can include an etch material. When placed in a processing chamber of an electronics processing system, such as an etching chamber, the etch material can be etched away, thus exposing first layer 222. In some embodiments, a third layer (not shown) can be positioned on second layer 230. The third layer can include a mask, such as a hard mask or a soft mask, that defines features on the surface of device 220.

Referring now to FIGS. 2E and 2F, a first layer 242 can be deposited on a surface of a device 240. First layer 242 can include two or more sense materials 244, as described with respect to FIGS. 2C and 2D. In some embodiments, each sense material 244 can be deposited on a portion of the surface of device 240 such that each sense material is deposited on a distinct portion of the surface of device 240, as illustrated. Each sense material 244 can be associated with a distinct optical signature. Each optical signature can correspond to a specific wavelength that is detectable by the optical detection component. By depositing each sense material 244 on distinct portions of the surface of device 240, an operator can detect whether one or more portions of the surface of device 240 (e.g., a left portion, a right portion, etc.) are etching more quickly than other portions of the surface of device 240.

A second layer 246 can be deposited on first layer 242. Second layer 246 can include an etch material. When placed in a processing chamber of an electronics processing system, such as an etching chamber, the etch material can be etched away, thus exposing first layer 242. In some embodiments, a third layer (not shown) can be positioned on second layer 246. The third layer can include a mask, such as a hard mask or a soft mask, that defines features on the surface of device 240.

Device 220 and/or device 240 can be used to determine an overall etch rate of a processing chamber, in accordance with previously described embodiments. A processing device can determine an etch rate for each distinct portion of the surface of device 220 and/or device 240 that is covered with a sense material. For example, the processing device can determine a first etch rate for a portion of the surface of device 220 that is covered by first sense material 224 and a second etch rate for the portion of the surface of device 220 that is covered by second sense material 226 In some embodiments, a difference between each of the first etch rate and the second etch rate can satisfy (i.e., meet or exceed) a difference threshold. In such embodiments, the processing device can determine the overall etch rate for the processing chamber to be the smallest determined etch rate. In other or similar embodiments, the processing device can determine the overall etch rate for the processing chamber to be an average of each determined etch rate. For example, the first etch rate can be approximately 1.0 nm/s and the second etch rate can be approximately 1.1 nm/s. The threshold difference can be approximately 0.1 nm/s. As a difference between each of the first etch rate and the second etch rate satisfies the difference threshold, the processing device can determine the etch rate of the processing chamber to be 1.0 nm/s, which is the smallest determined etch rate. In another example, the processing device can determine the etch rate of the processing chamber to be approximately 1.05 nm/s, which is approximately the average of each determined etch rate.

Figure 5A:
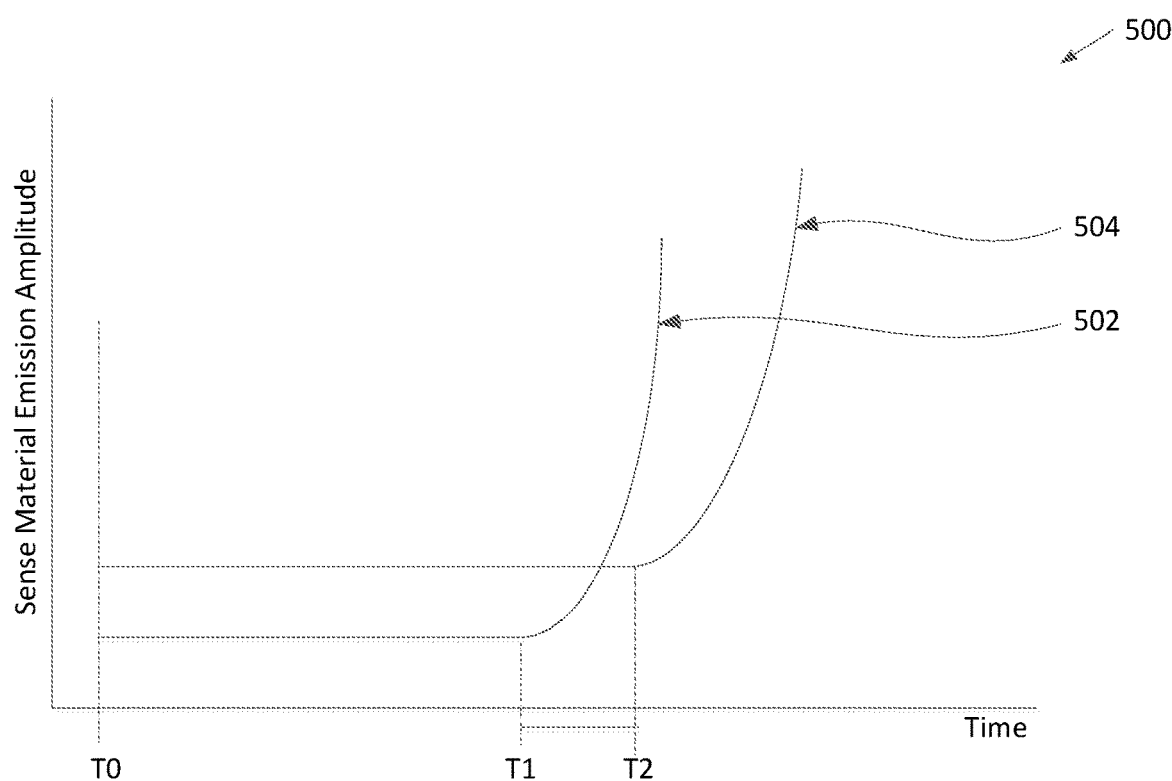
FIG. 5A depicts a graph indicating emission amplitudes of optical signatures associated with one or more sense materials over time, according to aspects of the present disclosure.

Based on the determined etch rate for each portion of the surface of device 220, the processing device can determine whether the etch rate is uniform across the surface of device 220. FIG. 5A depicts a graph 500 indicating emission amplitudes of optical signatures associated with one or more sense materials over time, according to aspects of the present disclosure. Graph 500 can be generated in accordance with embodiments described with respect to FIG. 4A. The optical detection component can detect the one or more sense materials during an etch process performed for a device, such as device 220 of FIGS. 2C and 2D or device 240 of FIGS. 2E and 2F. An amplitude of an optical signature associated with each sense material during the etch process is represented by a distinct curve on graph 500. For example, the amplitude of the optical signature associated with first sense material 224 of the first layer 222 of device 220 is represented by curve 502, while the amplitude of the optical signature associated with second sense material 226 of the first layer 222 is represented by curve 504.

The etch process can begin at time T0. During a first period of the etch process (from time T0 to time T1), an etch material of a second layer 230 deposited on the surface of device 200 is etched away and the optical detection component does not detect the sense materials of the first layer 222. During a second period of the etch process (from time T1 to time T2), the optical detection component detects the first sense material 224 of the first layer 222 based on an optical signature associated with the first sense material 224. During a third period of the etch process (beginning at time T2), the optical detection component detects the second sense material 226 of the first layer 222.

The processing device can determine whether the etch rate is uniform across the surface of device 200 based on a threshold duration of time between an instance the first sense material 224 is first detected and an instance the second sense material 226 is first detected. The duration of time between the instance the first sense material 224 is first detected and the instance the second sense material 226 is first detected can correspond with the second period of the etch process (from time T1 to time T2). The processing device can determine that the etch rate is uniform across the surface of device 220 in response to determining that the duration of time between the instance the first sense material 224 is first detected and the instance the second sense material 226 is first detected satisfies the threshold duration of time.

In an illustrative example, the threshold duration of time can be approximately 0.3 seconds. Time T1 of graph 500 can indicate approximately 1 second after the initiation of the etch process at a processing chamber (e.g., at T0). Time T2 of graph 500 can indicate approximately 1.5 seconds after the initiation of the etch process. The duration of time between time T1 and time T2 can be approximately 0.5 seconds. As 0.5 seconds is more than the threshold duration of time of approximately 0.3 seconds, the processing device can determine that the etch rate is not uniform across the surface of device 220. In such embodiments, the processing device can modify the initial etch parameter settings used during the etch process associated with graph 500 to decrease the duration of time between time T1 and time T2.

Figure 5B:
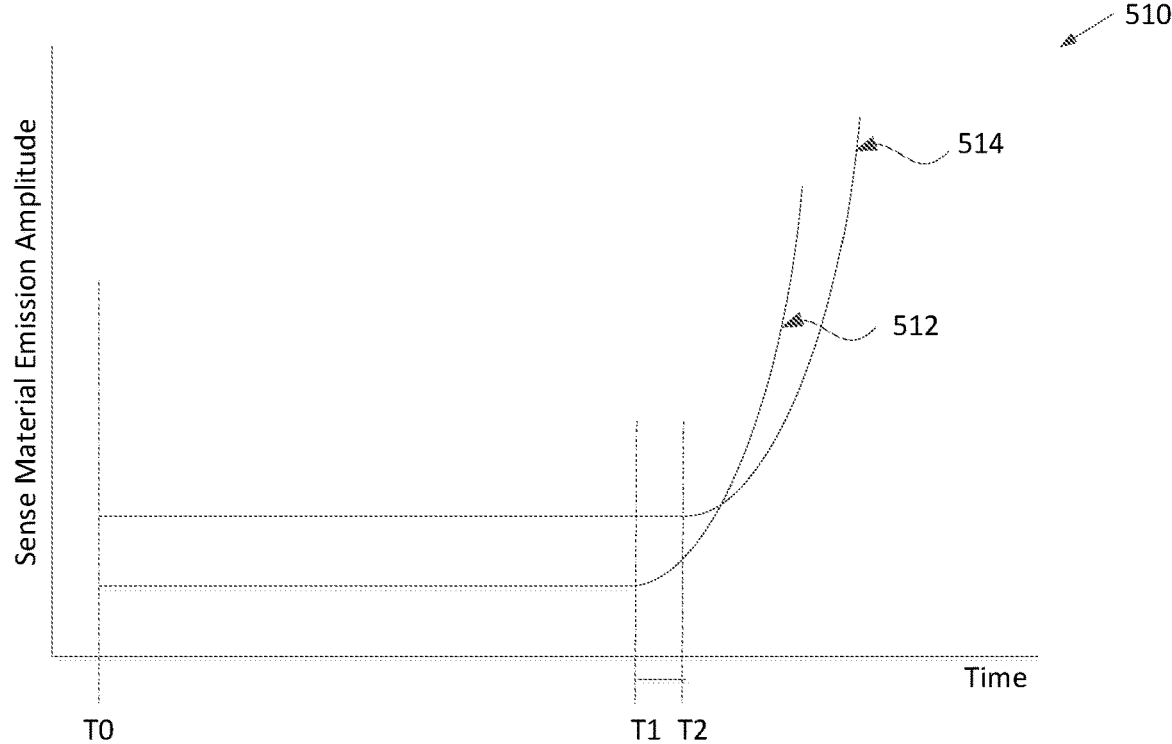
FIG. 5B depicts another graph indicating emission amplitudes of optical signatures associated with one or more sense materials over time, according to aspects of the present disclosure.

FIG. 5B depicts a graph 510 indicating an emission amplitude of multiple optical signatures associated with sense materials over time, according to aspects of the present disclosure. Graph 510 can be generated in accordance with embodiments described with respect to FIG. 5A. The amplitude of the optical signature associated with first sense material 224 can is represented by curve 512 and the amplitude of the optical signature associated with the second sense material 226 s represented by curve 514. In accordance with the previous illustrated example, the threshold duration of time between a first point in time that an optical signature associated with the sense material was detected by the optical detection component and a second point in time that an amplitude of the optical signature remained at a constant amplitude can be approximately 0.3 seconds. Time T1 of graph 510 can indicate approximately 1 second after the initiation of the etch process at a processing chamber (e.g., at T0). Time T2 of graph 510 can indicate approximately 1.2 seconds after the initiation of the etch process. The duration of time between time T1 and time T2 can be approximately 0.2 seconds. As 0.2 seconds is less than the threshold duration of time of approximately 0.3 seconds, the processing device can determine that the etch rate is uniform across the surface of device 200. In such embodiments, the processing device can set the initial etch parameter used during the etch process associated with graph 500 to be optimized etch parameter settings.

FIGS. 2G and 2H depict another example device 260 for in-situ detection of an etch rate and etch rate uniformity of a processing chamber, according to aspects of the present disclosure. A first layer can be formed on a surface of device 260. The first layer can include one or more test coupons 262 where each test coupon is placed at a distinct portion of the surface of device 260. Each test coupon 262 can include at least a first layer 264 and a second layer 266. First layer 264 can be deposited on a first surface of a test coupon 262 and second layer 266 can be deposited on first layer 264. First layer 264 can be composed of a sense material. In some embodiments, the first layer 264 of each test coupon 262 can be composed of a distinct sense material. Second layer 266 can be composed of an etch material. When device 260 is placed in a processing chamber of an electronics processing system, such as an etching chamber, the etch material of second layer 266 can be etched away, thus exposing first layer 264. In some embodiments, the second layer 266 of each test coupon 262 can be composed of the same etch material. In some embodiments, a third layer (not shown) can be positioned on second layer 266. The third layer can include a mask, such as a hard mask or a soft mask, that defines features on the surface of each test coupon 262.

In some embodiments, an edge of each test coupon 262 can be encapsulated with a protective material to reduce and/or prevent the edge of the etch material of second layer 266 and/or the sense material of first layer 264 from etching away, thus interfering with the optical detection component's ability to detect the optical signature of the sense material of first layer 264. The protective material can be composed of a polymeric material, such as an epoxy or a polyimide. In some embodiments, the first layer 264 can be encapsulated with a protective material. In other or similar embodiments, the first layer 264 and the second layer 266 can be encapsulated with the protective material.

Figure 2J:
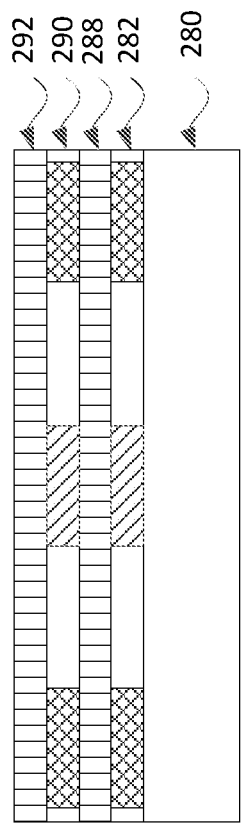
FIG. 2I and FIG. 2J depict another example device for in-situ detection of an etch rate uniformity of a processing chamber, according to aspects of the present disclosure.
Figure 2I:
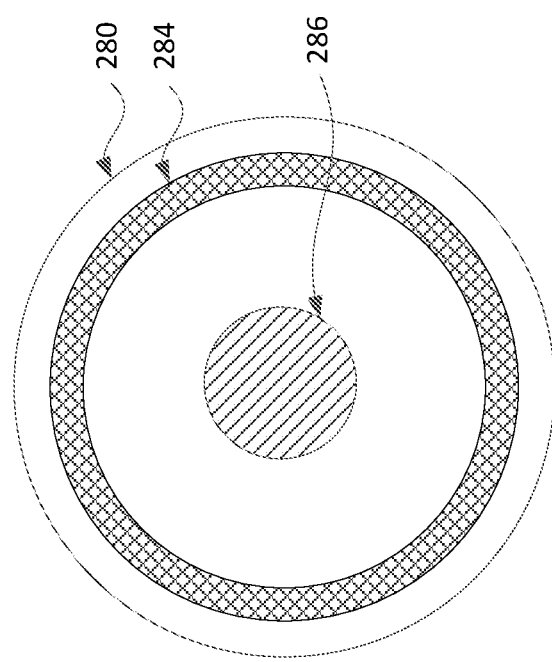

FIG. 2I and FIG. 2J depict another example device 280 for in-situ detection of an etch rate uniformity of a processing chamber, according to aspects of the present disclosure. A first layer 282 can be deposited on a surface of device 280. First layer 282 can include at least a first sense material 284 and a second sense material 286, as illustrated. First sense material 284 and second sense material 286 can be deposited on distinct portions of the surface of device 280. For example, first sense material 284 and second sense material 286 can be deposited in a radial pattern such that first sense material 284 is deposited at an outer diameter of device 280 and second sense material 286 is deposited at an inner diameter, or center, of device 280. First sense material 284 and second sense material 286 can each be associated with a distinct optical signature. Each optical signature can correspond to a specific wavelength that is detectable by an optical detection component, such as optical detection component 160 described with respect to FIG. 1. By depositing the first sense material 284 on the outer diameter and the second sense material 286 on the inner diameter, an operator can detect whether the edges of the surface of device 280 are etching more quickly than the center of the surface of device 280 during the etch process.

A second layer 288 can be deposited on first layer 282. Second layer 288 can include an etch material. In some embodiments, a third layer 290 can be deposited on second layer 288. Third layer 290 can include two or more sense materials. In some embodiments, third layer 290 can include the same sense materials (i.e., first sense material 284 and second sense material 286) as included in first layer 282. The two or more sense materials of third layer 290 can be deposited in a same or similar pattern as first sense material 284 and second sense material 286. A fourth layer 292 can be deposited on third layer 290. Fourth layer 292 can include an etch material, such as the etch material of second layer 288. In some embodiments, a sixth layer (not shown) can be positioned on fourth layer 292. The third layer can include a mask, such as a hard mask or a soft mask, that defines features on the surface of device 280.

When placed in a processing chamber of an electronics processing system, such as an etching chamber, the etch material of fourth layer 292 can be etched away, thus exposing third layer 290. During the etch process, the sense materials of third layer 290 can also be etched away, thus exposing second layer 288. Second layer 288 can be further etched away, exposing first layer 282, in accordance with previously described embodiments. By depositing multiple layers each including sense materials or etch materials, the same or a similar amount of data obtained during multiple etch rate uniformity tests can be collected and used to determine an etch rate of various portions of the surface of device 280.

Figure 6:
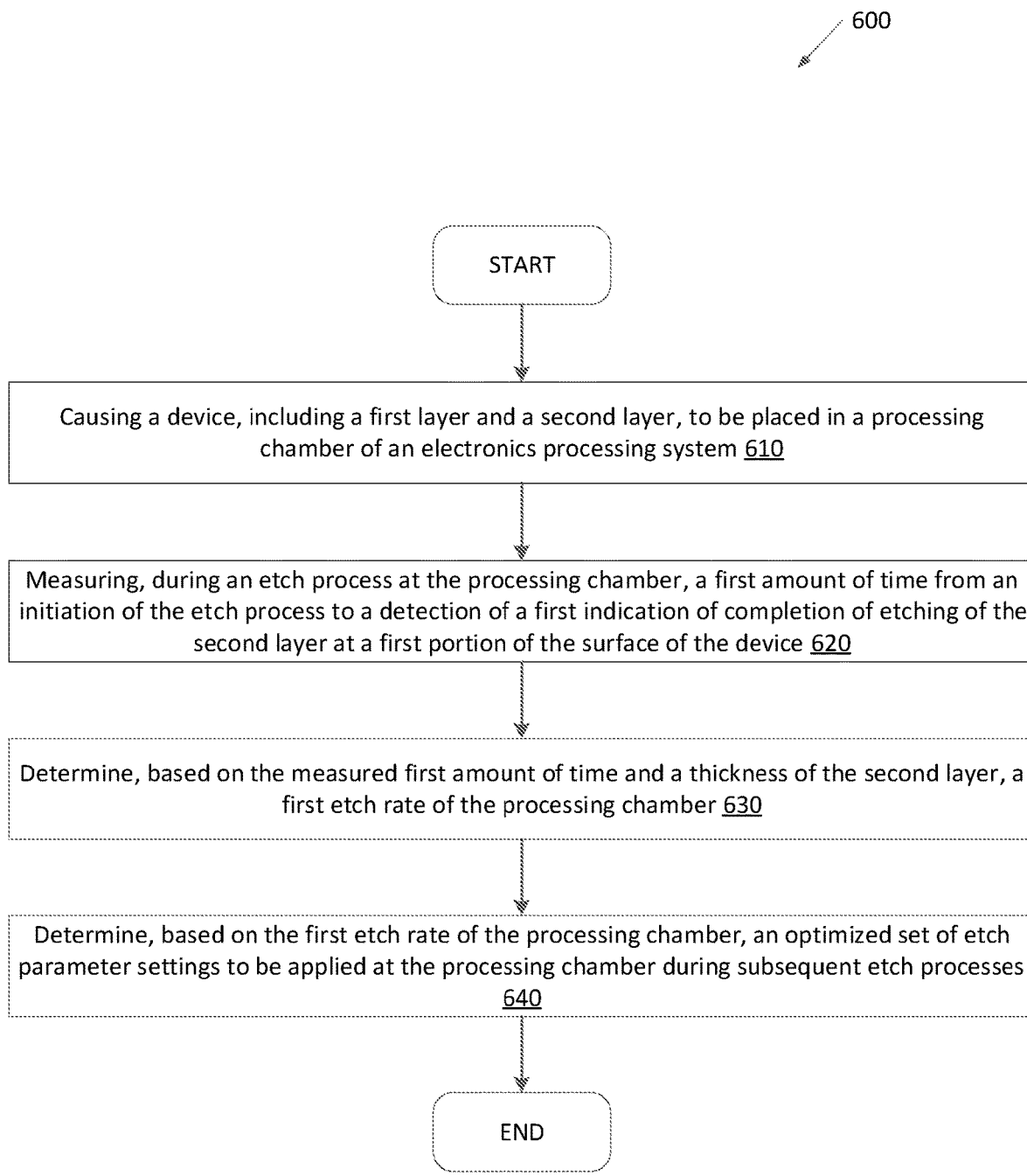
FIG. 6 illustrates a method for detecting an etch rate uniformity of a processing chamber, according to aspects of the present disclosure.

FIG. 6 illustrates a method 600 for detecting an etch rate uniformity of a processing chamber, according to aspects of the present disclosure. In some embodiments, method 600 can be performed by a processing device, such as the system controller described with respect to FIG. 1. At block 610, the processing device causes a device to be placed in a processing chamber of an electronics processing system. In some embodiments, the processing device can cause the device to be placed in the processing chamber by a robot arm of a robot of the electronics processing system. In other or similar embodiments, the processing device can transmit a notification to an operator of the electronics device manufacturing system to prompt the operation to manually place the device in the processing chamber. The device can include a first layer and a second layer. The first layer can include one or more sense materials and the second layer can include an etch material. At block 620, the processing device measures a first amount of time from an initiation of the etch process to a detection (i.e., by an optical detection component) of a first indication of completion of etching of a second layer at a first portion of the surface of the device during an etch process at the processing chamber. The etch process can etch the second layer of the device based on an initial set of etch parameter settings. At block 630, the processing device can determine a first etch rate of the processing chamber based on the measured first amount of time and a thickness of the second layer. At block 640, the processing device can determine an optimized set of etch parameter settings to be applied at the processing chamber during subsequent etch processes.

In some embodiments, the processing device can obtain multiple etch rates for one or more materials deposited on the surface of the device. For example, one or more operations of method 600 can be performed multiple times and processing device can determine multiple values for the first etch rate and/or the second etch rate. The processing device can use each determined value to determine the etch rate uniformity of the processing chamber over an extended time period.

Figure 7:
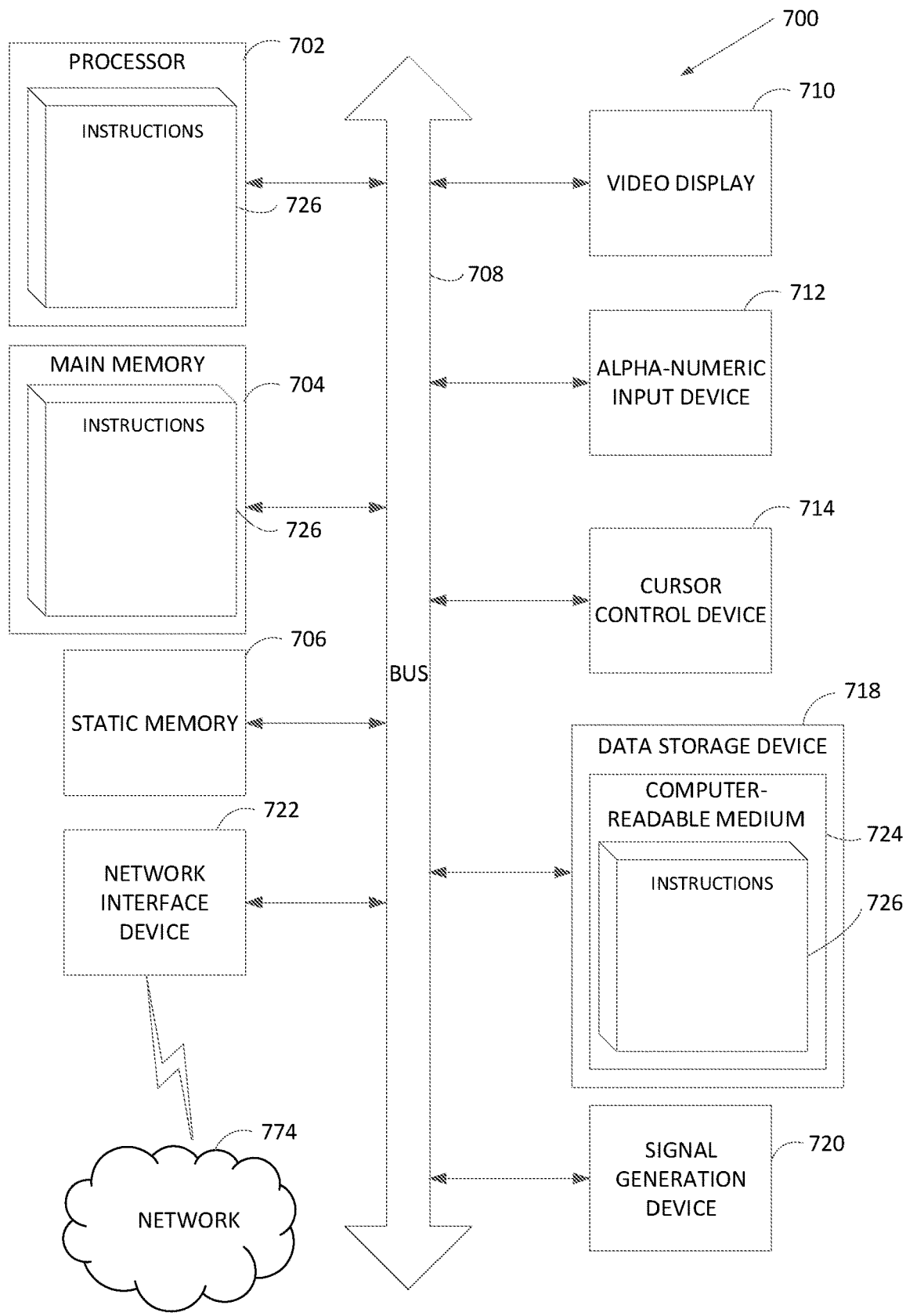
FIG. 7 is a block diagram illustrating a computer system, according to certain embodiments.

FIG. 7 is a block diagram illustrating a computer system 700, according to certain embodiments. In some embodiments, computer system 700 can be the system controller described with respect to FIG. 1. In some embodiments, computer system 700 can be connected (e.g., via a network, such as a Local Area Network (LAN), an intranet, an extranet, or the Internet) to other computer systems. Computer system 700 can operate in the capacity of a server or a client computer in a client-server environment, or as a peer computer in a peer-to-peer or distributed network environment. Computer system 700 can be provided by a personal computer (PC), a tablet PC, a set-top box (STB), a Personal Digital Assistant (PDA), a cellular telephone, a web appliance, a server, a network router, switch or bridge, or any device capable of executing a set of instructions (sequential or otherwise) that specify actions to be taken by that device. Further, the term "computer" shall include any collection of computers that individually or jointly execute a set (or multiple sets) of instructions to perform any one or more of the methods described herein.

In a further aspect, the computer system 700 can include a processing device 702, a volatile memory 704 (e.g., random access memory (RAM)), a non-volatile memory 706 (e.g., read-only memory (ROM) or electrically-erasable programmable ROM (EEPROM)), and a data storage device 718, which can communicate with each other via a bus 708.

Processing device 702 can be provided by one or more processors such as a general purpose processor (such as, for example, a complex instruction set computing (CISC) microprocessor, a reduced instruction set computing (RISC) microprocessor, a very long instruction word (VLIW) microprocessor, a microprocessor implementing other types of instruction sets, or a microprocessor implementing a combination of types of instruction sets) or a specialized processor (such as, for example, an application specific integrated circuit (ASIC), a field programmable gate array (FPGA), a digital signal processor (DSP), or a network processor).

Computer system 700 can further include a network interface device 722 (e.g., that communicates via network 774). Computer system 700 also can include a video display unit 710 (e.g., an LCD), an alphanumeric input device 712 (e.g., a keyboard), a cursor control device 714 (e.g., a mouse), and a signal generation device 720.

In some implementations, data storage device 718 can include a non-transitory computer-readable storage medium 724 on which can store instructions 726 encoding any one or more of the methods or functions described herein, including instructions for implementing methods described herein (e.g., performing method 600 of FIG. 6).

Instructions 726 can also reside, completely or partially, within volatile memory 704 and/or within processing device 702 during execution thereof by computer system 700, hence, volatile memory 704 and processing device 702 can also constitute machine-readable storage media.

While computer-readable storage medium 724 is shown in the illustrative examples as a single medium, the term "non-transitory computer-readable storage medium" shall include a single medium or multiple media (e.g., a centralized or distributed database, and/or associated caches and servers) that store the one or more sets of executable instructions. The term "non-transitory computer-readable storage medium" shall also include any tangible medium that is capable of storing or encoding a set of instructions for execution by a computer that cause the computer to perform any one or more of the methods described herein. The term "non-transitory computer-readable storage medium" shall include, but not be limited to, solid-state memories, optical media, and magnetic media.

The methods, components, and features described herein can be implemented by discrete hardware components or can be integrated in the functionality of other hardware components such as ASICS, FPGAs, DSPs or similar devices. In addition, the methods, components, and features can be implemented by firmware modules or functional circuitry within hardware devices. Further, the methods, components, and features can be implemented in any combination of hardware devices and computer program components, or in computer programs.

Unless specifically stated otherwise, terms such as "scanning," "moving," "causing," "performing," "removing," "placing," "directing," "determining," "disposing," "actuating," "locating," or the like, refer to actions and processes performed or implemented by computer systems that manipulates and transforms data represented as physical (electronic) quantities within the computer system registers and memories into other data similarly represented as physical quantities within the computer system memories or registers or other such information storage, transmission or display devices. Also, the terms "first," "second," "third," "fourth," etc. as used herein are meant as labels to distinguish among different elements and do not have an ordinal meaning according to their numerical designation.

Examples described herein also relate to an apparatus for performing the methods described herein. This apparatus can be specially constructed for performing the methods described herein, or it can include a general purpose computer system selectively programmed by a computer program stored in the computer system. Such a computer program can be stored in a computer-readable tangible storage medium.

The methods and illustrative examples described herein are not inherently related to any particular computer or other apparatus. Various general purpose systems can be used in accordance with the teachings described herein, or it can prove convenient to construct more specialized apparatus to perform methods described herein and/or each of their individual functions, routines, subroutines, or operations. Examples of the structure for a variety of these systems are set forth in the description above.

The preceding description sets forth numerous specific details such as examples of specific systems, components, methods, and so forth in order to provide a good understanding of several embodiments of the present disclosure. It will be apparent to one skilled in the art, however, that at least some embodiments of the present disclosure can be practiced without these specific details. In other instances, well-known components or methods are not described in detail or are presented in simple block diagram format in order to avoid unnecessarily obscuring the present disclosure. Thus, the specific details set forth are merely exemplary. Particular implementations can vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of operations of each method can be altered so that certain operations can be performed in an inverse order so that certain operations can be performed, at least in part, concurrently with other operations. In another embodiment, instructions or sub-operations of distinct operations can be in an intermittent and/or alternating manner.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A method comprising:
    causing a device to be placed in a processing chamber of an electronics processing system, wherein the device comprises a first layer deposited on a surface of the device, and a second layer deposited on the first layer, wherein the first layer comprises:
        a first sense material selected from a first group of materials that, when in a plasma form, have a first optical signature within a first range of optical signatures, and
        a second sense material selected from a second group of materials that, when in the plasma form, have a second optical signature within a second range of optical signatures that is distinct from the first range of optical signatures,
        wherein the first sense material is located at a first region of the surface of the device and the second sense material is located at a second region of the surface of the device, and wherein the first region of the surface of the device and the second region of the surface of the device are separated by a third region of the surface of the device that does not include the first sense material or the second sense material,
        and wherein the second layer is deposited at the first region, the second region, and the third region, and comprises an etch material selected from a third group of materials that, when in the plasma form, have a third optical signature within a third range of optical signatures that is distinct from the first range of optical signatures and the second range of optical signatures;
    measuring, during an etch process at the processing chamber, a first amount of time from an initiation of the etch process to a detection of a first indication of completion of etching of the second layer at a first portion of the surface of the device, wherein the etch process etches the second layer of the device based on an initial set of etch parameter settings;
    determining, based on the measured first amount of time and a thickness of the second layer, a first etch rate of the processing chamber; and
    determining, based on the first etch rate of the processing chamber, an optimized set of etch parameter settings to be applied at the processing chamber during subsequent etch processes.

2. The method of claim 1, wherein the indication of completion of etching of the second layer comprises a first optical signature within the first range of optical signatures, wherein the first optical signature is detected by an optical detection component of the processing chamber.

3. The method of claim 2, further comprising:
    measuring, during the etch process, a second amount of time from the detection of the first indication to a detection of a second indication that the first optical signature satisfies an optical threshold criterion; and
    determining, based on the measured second amount of time, that an overall etch rate of the processing chamber is not uniform across the surface of the device,
    wherein the optimized set of etch parameter settings is determined to cause the overall etch rate of the processing chamber to be uniform across the surface of the device.

4. The method of claim 1, further comprising:
    measuring, during the etch process, a second amount of time from the initiation of the etch process to a detection of a second indication of completion of etching of the second layer at the second region of the surface of the device;
    determining, based on the measured second amount of time and the thickness of the second layer, a second etch rate of the processing chamber; and
    determining, based on a difference between the first etch rate and the second etch rate, that an overall etch rate of the processing chamber is not uniform across the surface of the device, wherein the optimized set of etch parameter settings is determined to cause the overall etch rate of the processing chamber to be uniform across the surface of the device.

5. The method of claim 2, wherein the first optical signature corresponds to a wavelength of a plurality of photons emitted by a plasma of the first sense material.

6. The method of claim 1, wherein the first sense material comprises at least one of a silicon-based material, a copper-based material, or a tungsten-based material.

7. The method of claim 1, wherein the device further comprises a mask positioned on the second layer, wherein the mask defines one or more features to be etched onto the surface of the device.

8. An article comprising:
    a device;
    a first layer deposited on a surface of the device, the first layer comprising:
        a first sense material selected from a first group of materials that, when in a plasma form, have a first optical signature within a first range of optical signatures, and
        a second sense material selected from a second group of materials that, when in the plasma form, have a second optical signature within a second range of optical signatures that is distinct from the first range of optical signatures,
        wherein the first sense material is located at a first region of the surface of the device and the second sense material is located at a second region of the surface of the device, and wherein the first region of the surface and the second region of the surface of the device are separated by a third region of the surface of the device that does not include the first sense material or the second sense material; and a second layer deposited on the first layer at the first region, the second region, and the third region, the second layer comprising an etch material selected from a third group of materials that, when in the plasma form, have a third optical signature within a third range of optical signatures that is distinct from the first range of optical signatures and the second range of optical signatures.

9. The article of claim 8, wherein the first sense material is associated with a first optical signature within the first range of optical signatures, and wherein the first optical signature of the first sense material can be detected at the first region of the surface of the device by an optical detection component of a processing chamber.

10. The article of claim 9, wherein the first optical signature corresponds to a wavelength of a plurality of photons emitted by a plasma of the first sense material.

11. The article of claim 8, wherein the first sense material comprises at least one of a silicon-based material, a copper-based material, or a tungsten-based material.

12. The article of claim 8, wherein the device further comprises a mask positioned on the second layer, wherein the mask defines one or more features to be etched onto the surface of the device.

13. The article of claim 8, wherein a maximum amplitude of each optical signature of the first range of optical signatures is higher than a maximum amplitude of each optical signature of the third range of optical signatures.

14. The article of claim 8, wherein the first sense material comprises a material that emits photons having a wavelength between 200 nanometers (nm) and 1100 nm.

15. The article of claim 8, wherein the first region of the surface of the device comprises an outer diameter of the device and the second region of the surface of the device comprises at least one of an inner diameter of the device or a center of the device.

16. The article of claim 8, wherein a distance between the first range of optical signatures and the third range of optical signatures satisfies one or more optical signature detectability criteria associated with an optical sensor of a processing chamber of an electronics processing system.

17. The article of claim 8, further comprising:

a third layer deposited on the second layer, the third layer comprising a third sense material selected from the first group of materials; and a fourth layer deposited on the third layer, the fourth layer comprising the etch material.

* * * * *